United States Patent
Ichinose

(10) Patent No.: US 6,538,305 B2
(45) Date of Patent: Mar. 25, 2003

(54) BGA TYPE SEMICONDUCTOR DEVICE HAVING A SOLDER-FLOW DAMPING/STOPPING PATTERN

(75) Inventor: Michihiko Ichinose, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/912,887

(22) Filed: Jul. 25, 2001

(65) Prior Publication Data
US 2002/0014683 A1 Feb. 7, 2002

(30) Foreign Application Priority Data
Jul. 27, 2000 (JP) ........................................ 2000-226528

(51) Int. Cl.[7] .............................................. H01L 23/495
(52) U.S. Cl. ........................................ 257/666; 257/667
(58) Field of Search ................................. 257/666, 697, 257/667

(56) References Cited

U.S. PATENT DOCUMENTS 6,285,081 B1 * 9/2001 Jackson ...................... 257/738

* cited by examiner

*Primary Examiner*—Amir Zarabian
*Assistant Examiner*—Kiesha Rose
(74) *Attorney, Agent, or Firm*—Choate, Hall & Stewart

(57) ABSTRACT

A semiconductor device includes an interposing substrate having a top surface mounting thereon a semiconductor chip and a bottom surface mounting thereon a solder ball islands. Chip electrodes of the semiconductor chip are connected to the solder ball islands through a top interconnect pattern, via holes and a bottom interconnect pattern. The second interconnect pattern has a solder-flow damping/stopping pattern in the vicinity of the solder ball islands for stopping the solder from flowing onto the bottom interconnect pattern upon melting.

7 Claims, 11 Drawing Sheets

BGA TYPE SEMICONDUCTOR DEVICE HAVING A SOLDER-FLOW DAMPING/STOPPING PATTERN

BACKGROUND OF THE INVENTION (a) Field of the Invention

The present invention relates to a BGA type semiconductor device having a solder-flow damping/stopping pattern and a method for manufacturing the same. More specifically, the present invention relates to a BGA type semiconductor device including an interconnect pattern having a function for damping/stopping solder flow instead of forming a solder resist layer, and to a manufacturing method thereof having a reduced process steps.

(b) Description of the Related Art

There are constantly strong demands for more fine-patterned and integrated semiconductor devices for obtaining smaller, lighter, faster, electronic equipment with increased functions. However, it becomes increasingly difficult to meet such demands simply by increasing the number of pins of the semiconductor chips, for example. In recent years, instead of the pin type semiconductor devices, ball grid array (hereinafter, referred to as BGA) type semiconductor devices have drawn larger attention.

Referring now to FIGS. 1 to 3, the structure of the BGA type semiconductor device is described below. FIG. 1 is a top plan view of a BGA type semiconductor device as viewed from the bottom surface of an interposing substrate 12, illustrating a semiconductor chip 14 mounted on a top surface of the interposing substrate 12 by a dotted line. FIG. 2 is an enlarged partial view of the interconnect pattern shown in FIG. 1. FIG. 3 is a combined sectional view which shows the combination of the sectional views taken along line I—I and line II—II in FIG. 1, illustrating the locational relationship in the sectional view of the semiconductor device between the semiconductor chip 14 and the solder balls 17.

As shown in FIGS. 1 to 3, the BGA type semiconductor device 10 is composed of the interposing substrate or interposer substrate 12, the semiconductor chip 14 die-bonded onto the top surface of the interposing substrate 12, and an encapsulating resin layer 15 which encapsulates therein the semiconductor chip 14 on the interposing substrate 12 together with the bonding wires not shown in the drawing.

The interposing substrate 12 has, on its bottom surface at which the interposer substrate 12 is mounted by a printed circuit board, a bottom interconnect pattern 16 which is electrically connected to the chip electrodes of the semiconductor chip 14 through the top interconnect pattern, and a plurality of solder balls 17 that are attached to respective solder ball islands (not shown) connected to the bottom interconnect pattern 16. During the process of surface-mounting the semiconductor device 10 on the printed circuit board, the solder balls 17 are melted together with respective solder bumps formed on the printed circuit board and thereby form respective bonding parts.

The encapsulating resin layer 15 encapsulates therein the semiconductor chip 14, and the chip electrodes (not shown) of the semiconductor chip 14 are electrically connected to the bottom interconnect pattern 16 on the interposing substrate 12. The bonding parts of the solder balls 17 are reinforced by a reinforcing resin 18.

The bottom interconnect pattern 16 is electrically connected through the interposing substrate 12 with a top interconnect pattern (not shown) which is bonded via gold wires to the chip electrodes of the semiconductor chip 14 mounted on the top surface of the interposing substrate 12. As shown in FIG. 2, the bottom interconnect pattern 16 is connected to the solder ball islands (19) and connects the solder balls 17 to the chip electrodes of the semiconductor chip 14 in the shortest possible distance on the bottom surface of the interposing substrate 12.

Referring now to FIGS. 4A to 4G, the process for manufacturing a conventional BGA type semiconductor device such as shown in FIG. 1 will be described below. The reference numerals for the constituent elements in FIGS. 4A to 4G are differentiated from those in FIGS. 1 to 3 for avoiding a confusion.

First, as shown in FIG. 4A, for starting fabrication of the BGA type semiconductor device 10, a die pad 22 and a top interconnect pattern 24 is formed on the top surface of the interpose substrate 28 onto which a semiconductor chip is to be mounted. At the same time, a bottom interconnect pattern, which is similar to the bottom interconnect pattern 16 in FIG. 7 and not shown in FIG. 9, is formed on the bottom surface of the interposing substrate 28. The bottom interconnect pattern 26 is connected to the top interconnect pattern 24 through via holes in the interposing substrate 28. Solder ball islands 26 formed on the bottom surface of the interposer substrate 28 are connected to the bottom interconnect pattern similarly to the island 19 shown in FIG. 2.

The thickness of the interposing substrate 28 is at least 50 $\mu$m and 100 $\mu$m at its maximum. The interposing substrate 28, which is a rigid plate in this example, may be a flexible tape instead. The die pad 22, the top interconnect pattern 24, and the solder ball islands 26 may be formed on the same side of the interposing substrate 28 in a single layer.

Next, as shown in FIG. 4B, the entire top and bottom surfaces of the interposing substrate 28 are coated with a 5-$\mu$m-thick solder resist layer 30.

Then, as shown in FIG. 4C, the solder resist layer 30 formed on the die pad 22, the bottom interconnect pattern 24 and the solder ball islands 26 is selectively removed to expose them through the solder resist layer 30.

In the next step, as shown in FIG. 4D, gold (Au) plating technique is applied to form a gold (Au) plating layer 32 on the exposed die pad 22, interconnect pattern 24 and solder ball islands 26.

Then, as shown in FIG. 4E, a semiconductor chip 36 is fixed onto the die pad 22 by using a mounting agent 34 made of an epoxy resin adhesive or the like. Subsequently, each chip electrode 40 of the semiconductor chip 36 is bonded with a corresponding interconnect of the top interconnect pattern 24 by using a gold (Au) wire 38.

Next, as shown in FIG. 4F, the semiconductor chip 36, the gold wires 38, and the top interconnect pattern 24 are encapsulated in an encapsulating resin layer 42. A plurality of solder balls 44 are then mounted on the respective solder ball islands 26 and then melted to form bonding parts.

The solder resist layer 30 is formed in the vicinity of the solder ball islands 26, covering the bottom interconnect pattern 16, to prevent molten solder from flowing onto the bottom interconnect pattern 16, as shown in FIG. 5, when the mounted solder balls are melted.

Next, as shown in FIG. 4G, epoxy resin is coated onto the base of the solder balls 44 to form a reinforcement resin layer 46 to enhance the bonding strength of the solder balls 44, whereby the BGA type semiconductor device 20 is obtained.

In the above conventional BGA type semiconductor device, it is necessary that the solder resist layer 30 block the flow of molten solder when the solder balls 44 are melted on the solder ball islands 26.

Namely, when the solder balls 44 are mounted and melted in a re-flow furnace, the solder resist layer 30 is formed to block the flow of molten solder. Therefore, the process of coating a solder resist layer 30 is important for blocking the molten solder ball 44. In addition, after the solder resist coating process and the subsequent melting process, the process of removing the solder resist layer 20 is also necessary to expose the die pad 22, the interconnect pattern 24 and the solder ball islands 26. The process for forming and removing the solder resist layer 30 complicates the manufacturing process for the semiconductor device.

SUMMARY OF THE INVENTION

It is therefore an object of the present invention to provide a BGA type semiconductor device having a solder-flow damping/stopping structure, instead of the solder resist layer, to simplify the manufacturing process for the semiconductor device.

DETAILED DESCRIPTION OF THE PREFERRED EMBODIMENT

Hereinafter, a preferred embodiment of the present invention will be described in detail by way of an example, with reference to the accompanying drawings.

Figure 6:
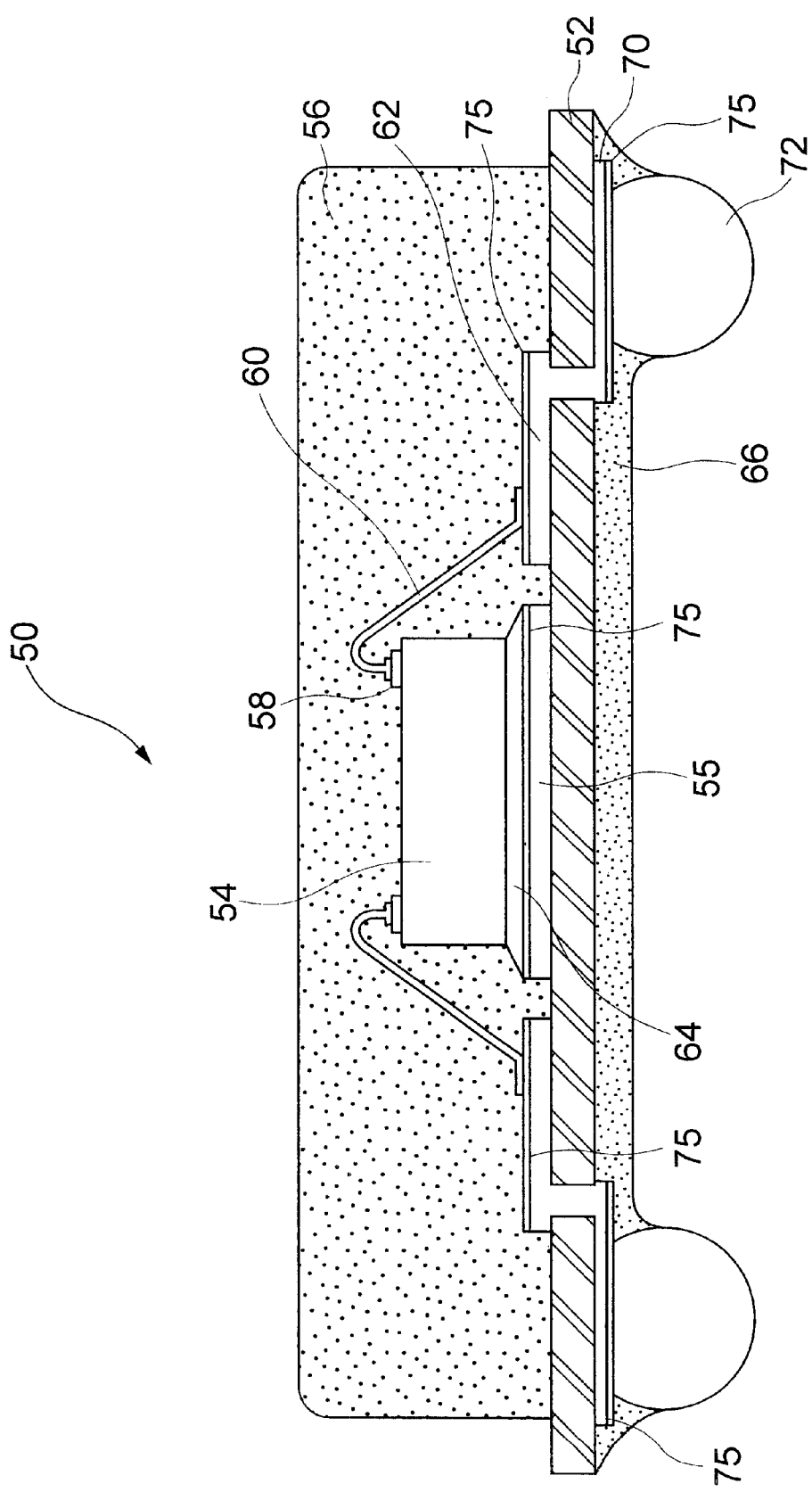
FIG. 6 is a sectional view of the structure of a BGA type semiconductor device according to a preferred embodiment of the present invention.

Referring now to FIG. 6, a semiconductor device, generally designated by numeral 50, according to the present embodiment is directed to a BGA type semiconductor device. The semiconductor device 50 includes an interposing substrate 52, a semiconductor chip 54 die-bonded onto a top surface of the interposing substrate 52, and a resin encapsulating layer 56 that encapsulates the semiconductor chip 54 therein on the top surface of the interposing substrate 52.

The interposing substrate 52 has, on its top surface mounting thereon the semiconductor chip 54, a die pad 55 to which the semiconductor chip 54 is bonded, and a top interconnect pattern 62 connected to the chip electrodes 58 of the semiconductor chip 54 via gold (Au) wires 60. The semiconductor chip 54 is bonded onto the die pad 55 by using a mounting agent 64 made of an epoxy-based adhesive.

Figure 1:
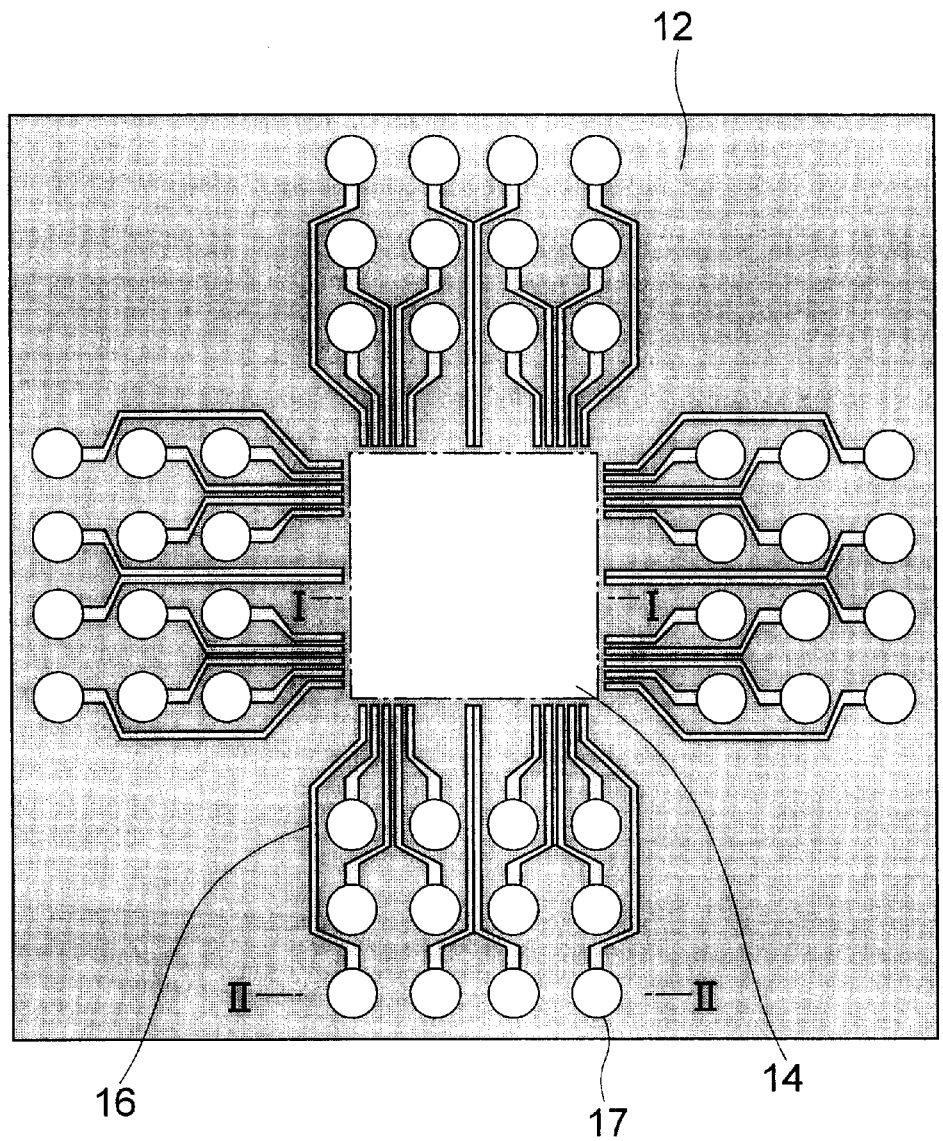
FIG. 1 is a top plan view of a conventional BGA type semiconductor device.
Figure 2:
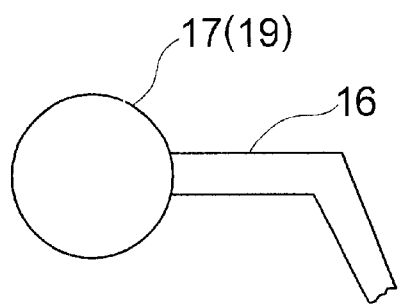
FIG. 2 is an enlarged partial top plan view of the interconnect pattern shown in FIG. 1.
Figure 3:
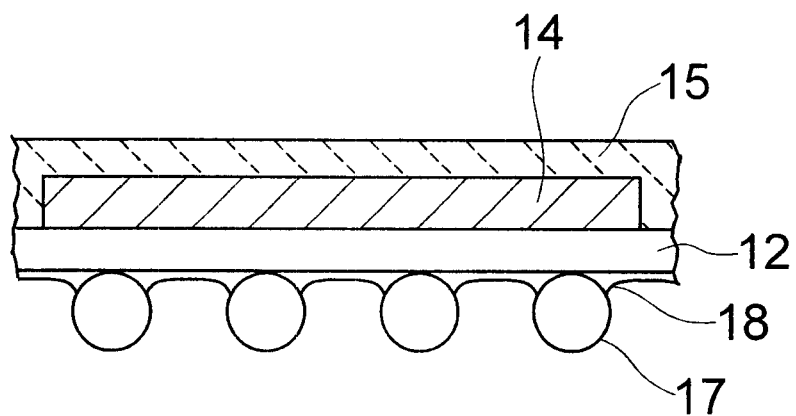
FIG. 3 is a combination of sectional views taken along line I—I and line II—II in FIG. 1.
Figure 4A:
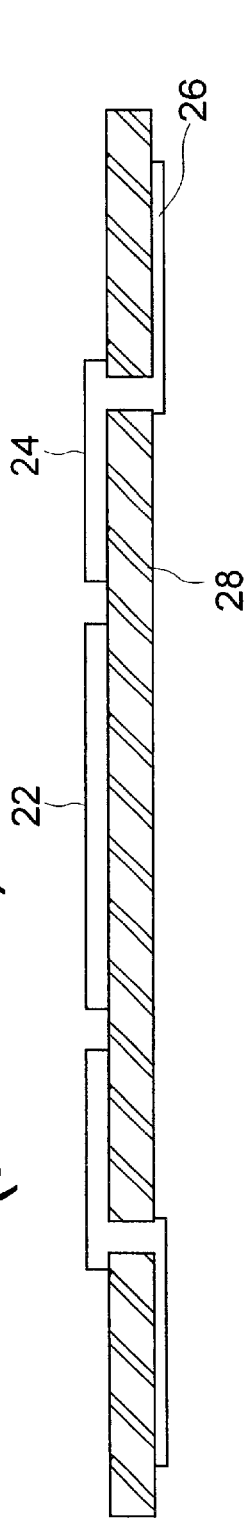
FIGS. 4A to 4G are sectional views of the semiconductor device of FIG. 1, showing consecutive steps of fabrication thereof.
Figure 4B:
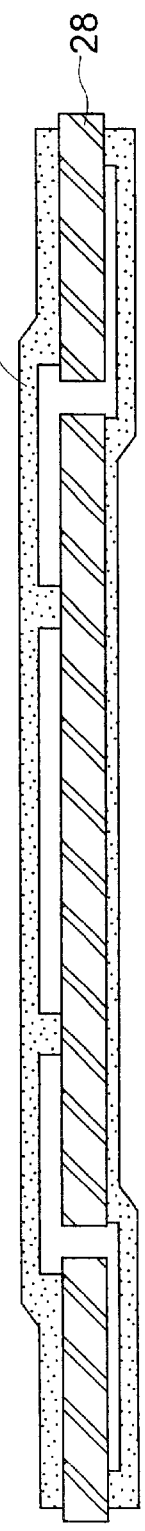
Figure 4C:
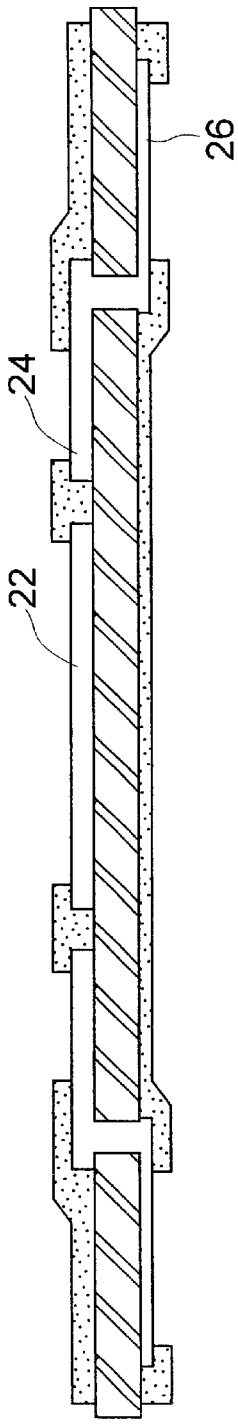
Figure 4D:
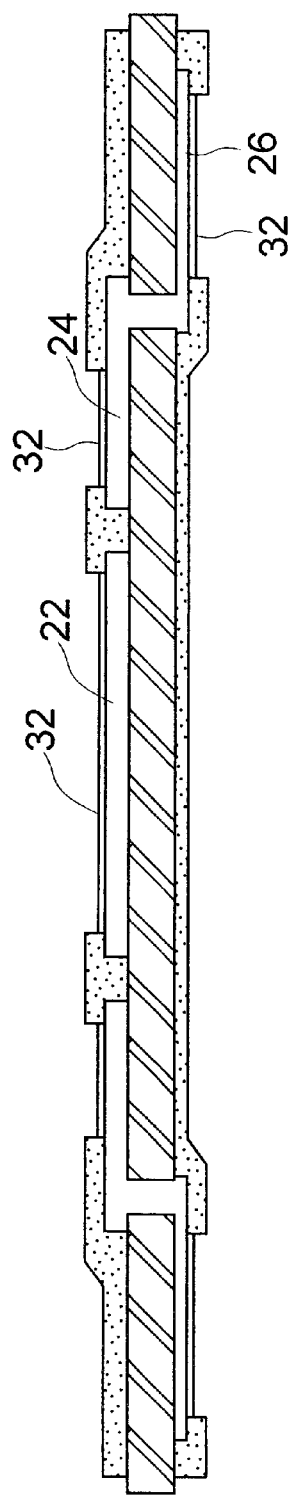
Figure 4E:
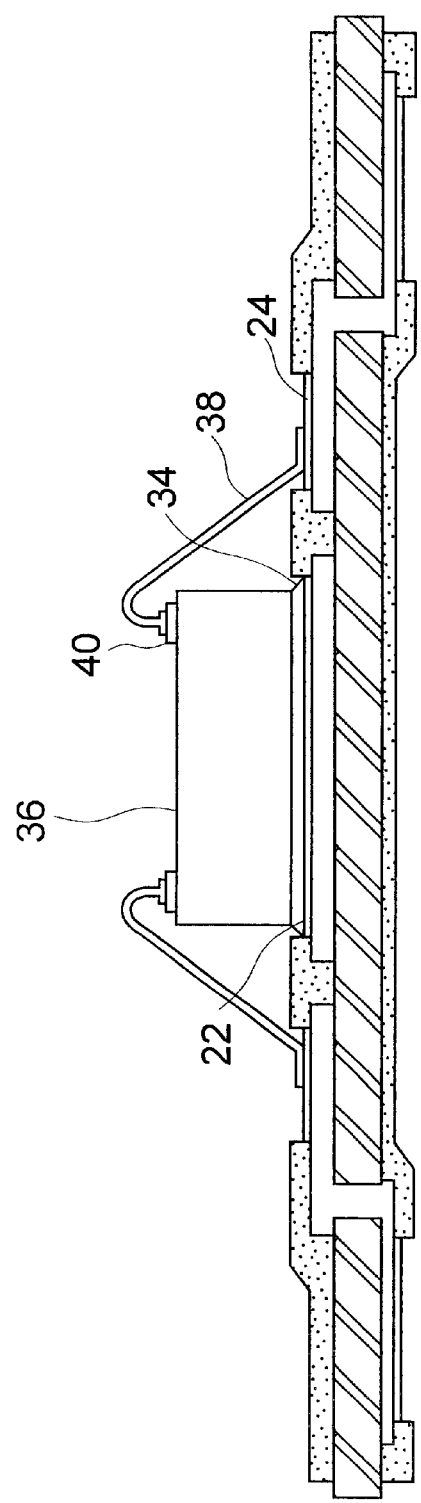
Figure 4F:
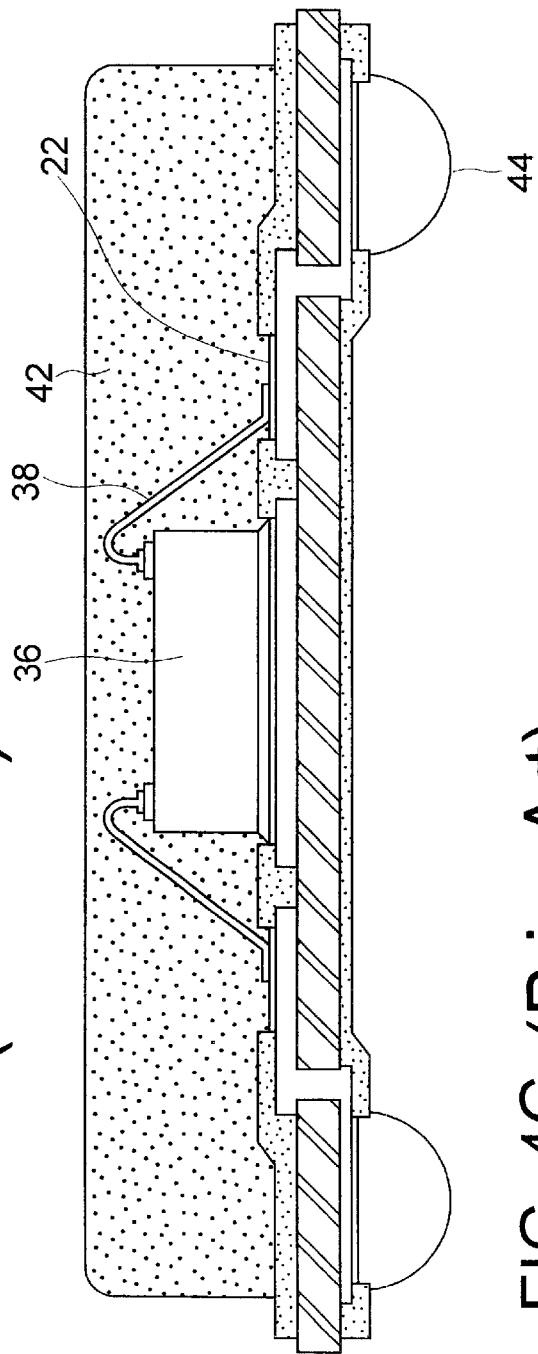
Figure 4G:
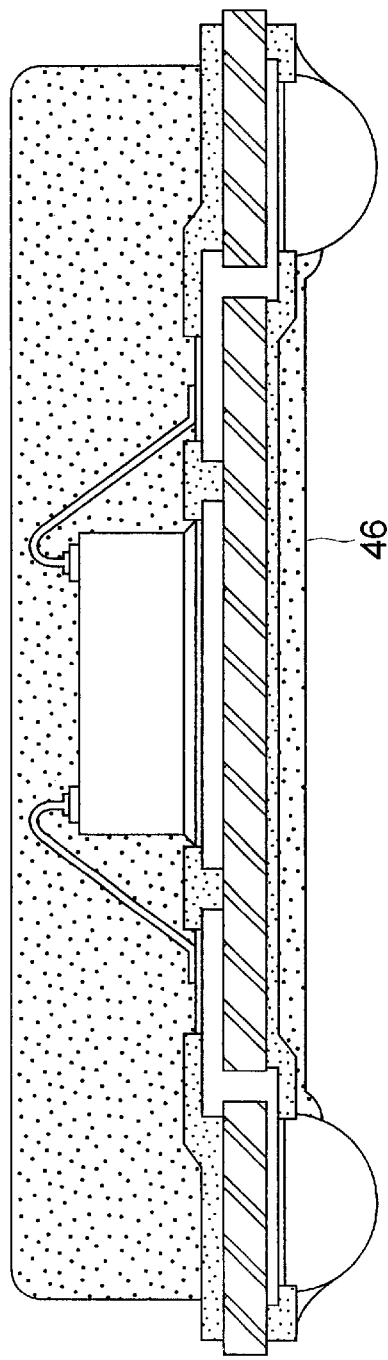
Figure 5:
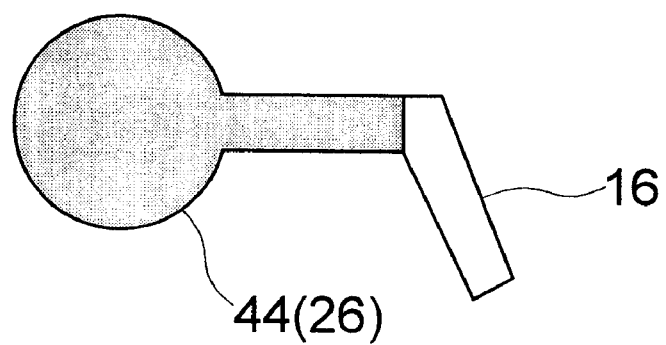
FIG. 5 is a partial top plan view showing a problem of solder flow when a solder resist layer is absent in the conventional BGA type semiconductor device.

The bottom surface, namely, the other surface of the interposing substrate 52 opposite to the top surface thereof mounting the semiconductor chip, has a configuration similar to the bottom surface of the interposing substrate 12 of the conventional semiconductor device 10 shown in FIG. 1 except that the bottom interconnect pattern in the present embodiment has a solder-flow damping/stopping structure and is not covered by a solder resist layer.

More specifically, the bottom interconnect pattern in the present embodiment has a solder-flow damping/stopping pattern in the vicinity of each of the coupling parts between the bottom interconnect pattern and the solder ball islands.

The interposing substrate 52 has, on its bottom surface opposite to the top surface mounting thereon the semiconductor chip, a bottom interconnect pattern 68 (refer to FIG. 7) that is electrically connected to the top interconnect pattern 62 through the interposing substrate 52, and coated with a resin layer, for example, epoxy-based resin layer 66. Also on the bottom surface of the interposing substrate 52 are exposed solder balls 72 bonded onto the solder ball islands 70 that are connected to the bottom interconnect pattern 68 on the bottom surface.

Figure 7:
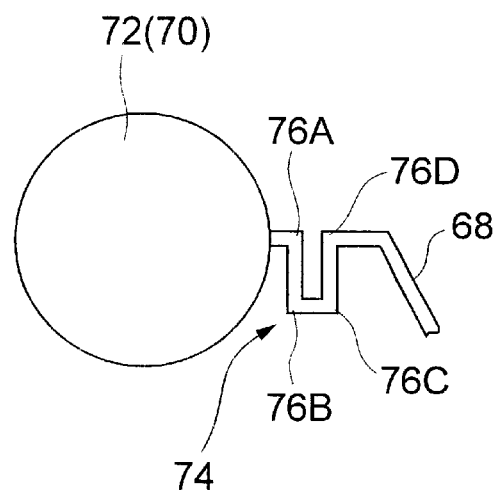
FIG. 7 is a top plan view illustrating the solder ball and the bottom interconnect pattern shown in FIG. 6.

Referring now to FIG. 7, the bottom interconnect pattern 68 has the solder-flow damping/stopping pattern 74 that damps and stops the molten solder from flowing onto the bottom interconnect pattern 68. The molten solder is likely to flow from the solder balls 72 when the solder balls 72 on the solder ball islands 70 are melted for bonding. This damping/stopping pattern 74 is formed in the vicinity of each of the coupling parts between the bottom interconnect pattern 68 and the solder ball islands 70.

The die pad 55, top interconnect pattern 62, bottom interconnect pattern 68 and solder ball islands 70 are made of a Cu film and have a gold (Au) plating layer 75 formed on the surfaces of the Cu film.

Basically, the damping/stopping pattern 74 has the same width as the line width of the bottom interconnect pattern 68. As shown in FIG. 7, the damping/stopping pattern 74 has four kinks including first to fourth kinks 76A–76D that bend at an angle of 90 degrees on the bottom surface of the interposing substrate 52. The bend angle may be less than 90 degrees.

Figure 8:
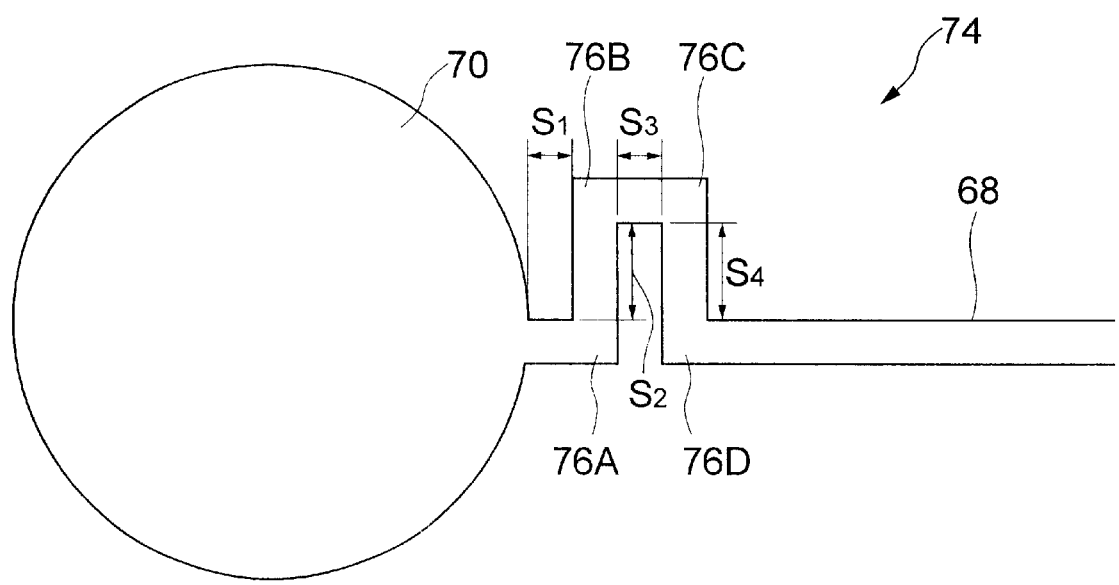
FIG. 8 is an enlarged partial view of FIG. 7.

The distance between the solder ball island 70 and the first kink 76A is substantially equal to the line width of the bottom interconnect pattern 68, or may be below the line width. To be more specific, as shown in FIG. 8, if the pattern width of the bottom interconnect pattern 68 is 40 $\mu$m, the distance S1 from the solder ball island 70 to the first kink 76A of the damping/stopping pattern 74 is 40 $\mu$m or below, the distance S2 from the first kink 76A to the second kink 76B is 100 $\mu$m, the distance S3 from the second kink 76B to the third kink 76C is 40 $\mu$m or below, and the distance S4 from the third kink 76C to the fourth kink 76D is 100 $\mu$m.

In the preferred embodiment of the invention, the bottom interconnect pattern 68 has the damping/stopping pattern 74 in the vicinity of the solder ball islands 70. When the solder balls 72 mounted on the respective solder ball islands 70 are melted to bond the solder balls 72 to the solder ball islands 70, the molten solder flowing from the solder balls 72 is damped by the damping/stopping pattern 74, and then blocked in the damping/stopping pattern 74. Therefore, it is unnecessary to coat the bottom interconnect pattern with a solder resist layer.

Figure 9A:
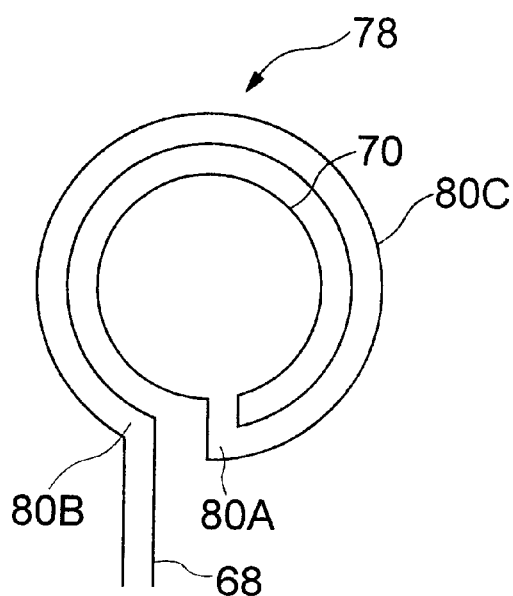
FIGS. 9A to 9C are top plan views showing variations of the damping/stopping pattern modified from the structure of the embodiment shown in FIG. 7.
Figure 9B:
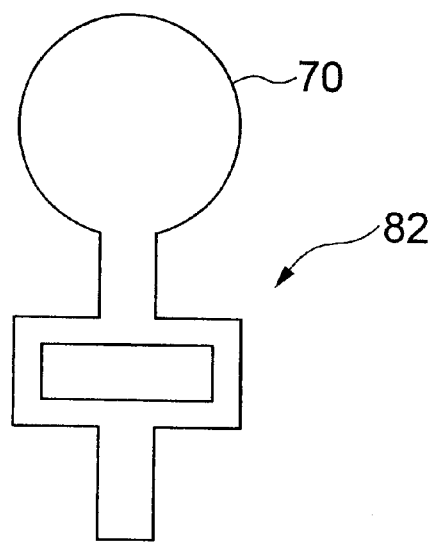
Figure 9C:
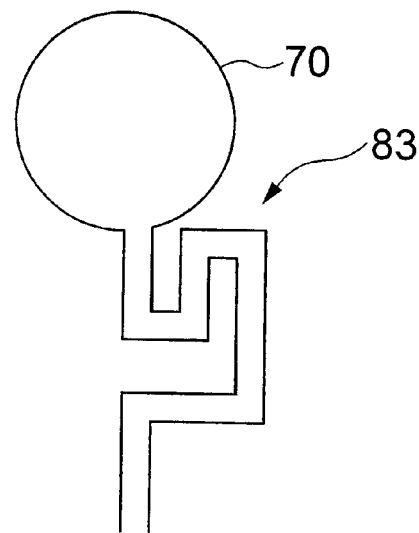

Referring to FIGS. 9A to 9C illustrating variations of the damping/stopping pattern according to the present embodiment, it will be understood that the damping/stopping pattern to be formed on the bottom interconnect pattern is not limited to the above embodiment. For example, as shown in FIG. 9A, the damping/stopping pattern 78 may have a bend at a first kink 80A adjacent to the coupling part between the bottom interconnect pattern 68 and the solder ball island 70, a substantially circular portion 80C extending around the solder ball island 70 on the surface of the interposing substrate 52, and another bend at a second kink 80B near the first kink 80A.

FIG. 9B illustrates another example of the damping/stopping pattern 82 in which the pattern is made of branching/merging patterns as viewed along the direction of a signal or current. FIG. 9C illustrates another example of the damping/stopping pattern 83 in which there are more than four kinks, for instance, six kinks.

Figure 10A:
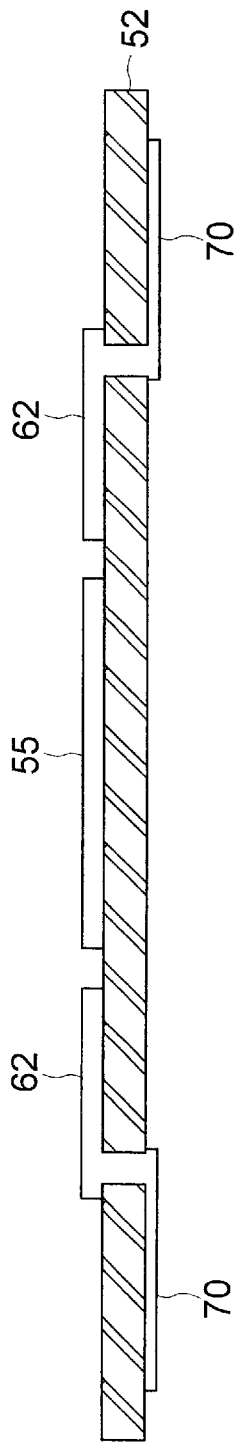
FIGS. 10A to 10E are sectional views of the semiconductor device of the present embodiment, showing consecutive steps of fabrication thereof.

Referring now to FIGS. 10A to 10E, first to FIG. 10A, an interposing substrate 52 is fabricated that has a top surface mounting thereon a die pad 55 and a top interconnect pattern 62, and a bottom surface mounting thereon a bottom interconnect pattern 68 which is connected to the top interconnect pattern 62 through the vial holes in the interposing substrate 52. The interposing substrate 52 may have at least one inner interconnect pattern as well as the via holes. The bottom interconnect pattern has a damping/stopping pattern which is similar to the damping/stopping pattern 74 shown in FIG. 7 or damping/stopping patterns shown in FIGS. 9A to 9C. On the bottom surface of the interposing substrate 52, there are also disposed solder ball islands 70 that are connected to the bottom interconnect pattern 68 through the damping/stopping pattern.

Figure 10B:
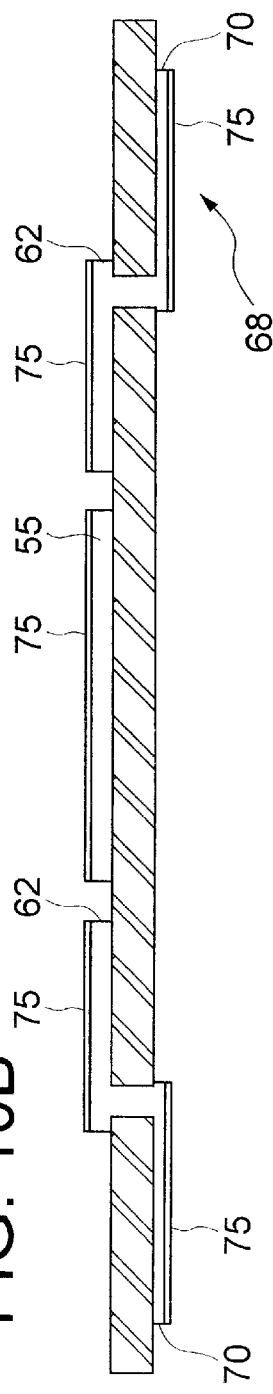

Next, as shown in FIG. 10B, a gold plating layer 75 is formed on the die pad 55, the top interconnect pattern 62, the bottom interconnect pattern 68 and the solder ball islands 70 by conducting a gold plating step.

Figure 10C:
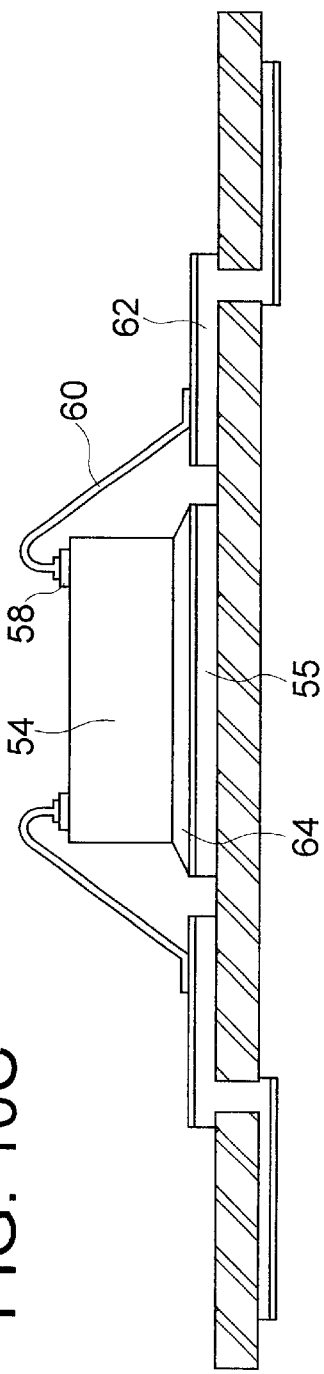

In the subsequent step, as shown in FIG. 10C, the semiconductor chip 54 is fixed onto the die pad 55 by using a mounting agent 64 made of an epoxy-based adhesive, for example. Next, the chip electrodes 58 of the semiconductor chip 54 are connected to the top interconnect pattern 62 by using gold (Au) wires 60.

Figure 10D:
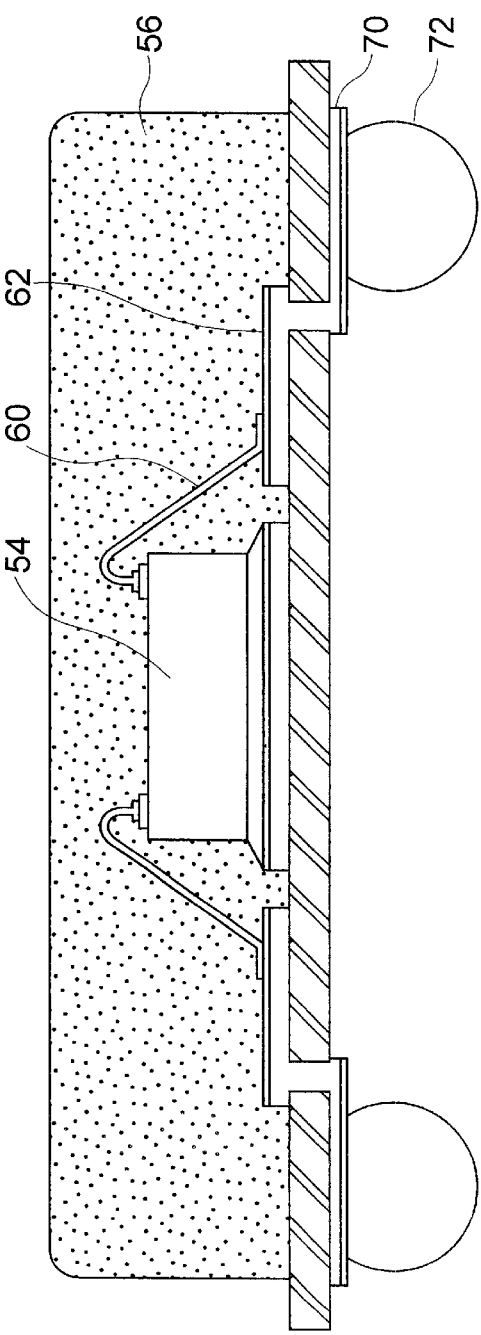

Thereafter, as shown in FIG. 10D, the semiconductor chip 54, the gold wires 60 and the top interconnect pattern 62 are encapsulated by an encapsulating resin layer 56. Next, solder balls 72 are mounted onto the solder ball islands 70 and then melted for forming a bonding structure.

Figure 10E:
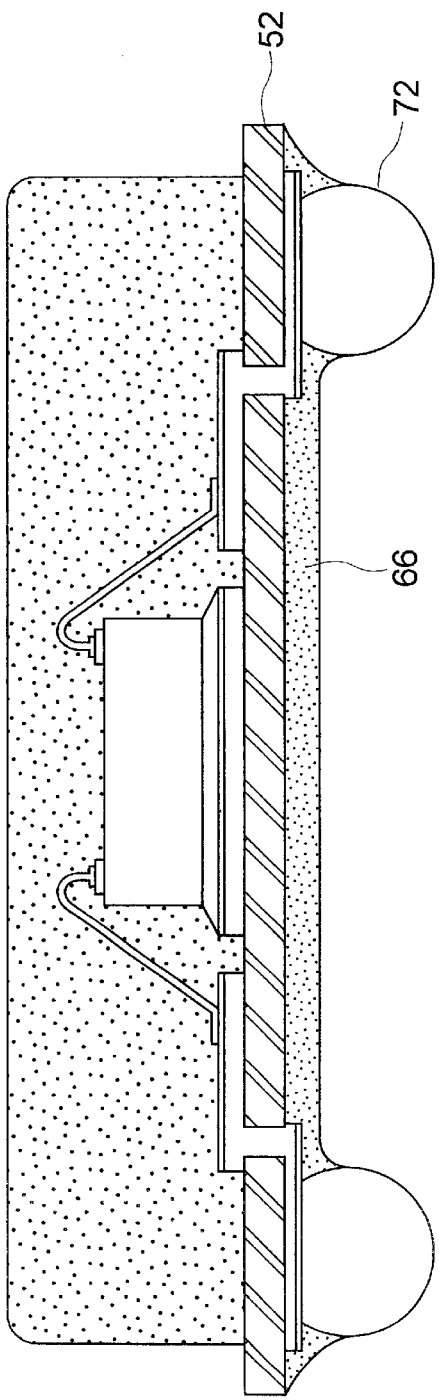

Then, as shown in FIG. 10E, an epoxy-based resin is coated onto the bottom surface of the interposing substrate 52 to form a bottom resin layer 66. As a result, the bonding parts between the solder balls 72 and solder ball islands 70 are reinforced, and the bottom interconnect pattern 68 is covered and protected by this bottom resin layer 66, whereby the BGA type semiconductor device 50 is obtained.

In this embodiment of the present invention, the solder balls 72 are mounted on the solder ball islands 70, where the solder balls 72 are melted together with the solder ball islands 70. The molten solder flow is damped by the damping/stopping pattern 74 (refer to FIG. 8), formed on the bottom interconnect pattern 68, and then blocked by the damping/stopping pattern 74.

As a result, the conventional process steps for applying the solder resist layer as a solder flow stopper layer and exposing the solder ball islands by removing this solder resist layer formed thereon are unnecessary.

According to the present embodiment, the interconnect pattern formed on the bottom surface of the interposing substrate has a damping/stopping pattern that is formed near the bonding parts between the interconnect pattern and solder ball islands. The damping/stopping pattern damps and then stops the molten solder flowing onto the interconnect pattern when the solder balls on the solder ball islands are melted for bonding. As a result, the molten solder flow is damped and then stopped by the damping/stopping pattern when the solder balls mounted on the solder ball islands are melted. Then, unlike the conventional semiconductor devices, it is not necessary to coat the bottom interconnect pattern with a solder resist layer. The interconnect pattern can be directly coated and protected by a bottom resin layer instead of the solder resist layer.

According to the method of the present embodiment, the solder balls are mounted on the solder ball islands and melted there. The molten solder flow is damped by the damping/stopping pattern, formed on the bottom interconnect pattern, and then blocked by the damping/stopping pattern. As a result, the conventional process for applying the solder resist layer as a solder flow stopper layer, and exposing the solder ball islands by removing this solder resist layer formed on the solder ball islands is unnecessary.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising an interposing substrate having first and second surfaces opposite to one another, said first surface mounting thereon a first interconnect pattern, said second surface mounting thereon a second interconnect pattern electrically connected to said first interconnect pattern and a plurality of solder ball islands connected to said second interconnect pattern, a semiconductor chip die-bonded onto said first surface, said semiconductor chip having a plurality of chip electrodes electrically connected to said first interconnect pattern, said second interconnect pattern including therein a plurality of solder-flow damping/stopping patterns formed in the second interconnect pattern, each of the damping/stopping patterns disposed adjacent to one of said solder ball islands for damping/stopping solder flowing from said one of said solder ball islands.

2. The semiconductor device as defined in claim 1, wherein said second interconnect pattern is covered directly by a resin layer.

3. The semiconductor device as defined in claim 1, wherein each said damping/stopping pattern includes a plurality of kinks formed in the second interconnect pattern, each having a bend of 90 degrees or below 90 degrees.

4. The semiconductor device as defined in claim 3, wherein said plurality of kinks include at least four kinks.

5. A semiconductor device comprising an interposing substrate having first and second surfaces opposite to one another, said first surface mounting thereon a first interconnect pattern, said second surface mounting thereon a second interconnect pattern electrically connected to said first interconnect pattern and a plurality of solder ball islands connected to said second interconnect pattern, a semiconductor chip die-bonded onto said first surface, said semiconductor chip having a plurality of chip electrodes electrically connected to said first interconnect pattern, said second interconnect pattern including therein a plurality of solder-flow damping/stopping patterns each disposed adjacent to one of said solder ball islands for damping/stopping solder flowing from said one of said solder ball islands, wherein said damping/stopping pattern includes a plurality of kinks each having a bend of 90 degrees or below 90 degrees, and wherein said solder-flow damping/stopping pattern includes a substantially circular portion between two of said kinks, said substantially circular portion extending around said one of said solder ball islands.

6. The semiconductor device as defined in claim 3, wherein a distance between one of said solder ball islands and an adjacent one of said kinks formed in the second interconnect pattern, of a corresponding one of said solder-flow damping/stopping patterns is equal to or below a line width of said second interconnect pattern.

7. A method for manufacturing a semiconductor device comprising the steps of:

forming a die-pad and a first interconnect pattern on a first surface of an interposing substrate;

forming a second interconnect pattern and a plurality of solder ball islands on a second surface of said interposing substrate, said second interconnect pattern being electrically connected to said first interconnect pattern and including a solder-flow damping/stopping structure in a vicinity of each of said solder ball islands;

mounting a semiconductor chip on said die-pad;

bonding each chip electrode of said semiconductor chip to said first interconnect pattern by bonding wires;

encapsulating said semiconductor chip and said bonding wires by using an encapsulating resin layer;

mounting and melting solder balls on respective said solder ball islands to bond said solder balls and respective said solder balls islands; and covering second interconnect pattern and said solder balls together with said solder ball islands by a resin layer.

* * * * *